(12) United States Patent
Okumura

(10) Patent No.: US 7,159,058 B2
(45) Date of Patent: Jan. 2, 2007

(54) STATE INDICATING INFORMATION SETTING CIRCUIT AND STATUS BIT SETTING CIRCUIT

(75) Inventor: Yoshiki Okumura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 238 days.

(21) Appl. No.: 10/773,232

(22) Filed: Feb. 9, 2004

(65) Prior Publication Data

US 2004/0193769 A1 Sep. 30, 2004

(30) Foreign Application Priority Data

Mar. 25, 2003 (JP) .............................. 2003-083473

(51) Int. Cl.
G06F 13/24 (2006.01)
G06F 13/32 (2006.01)
G06F 1/12 (2006.01)
G06F 1/04 (2006.01)
H03K 19/0175 (2006.01)
G05B 11/01 (2006.01)

(52) U.S. Cl. .................. 710/267; 326/62; 713/400; 713/500; 700/12

(58) Field of Classification Search ........ 710/260–269; 326/62; 713/400–600
See application file for complete search history.

(56) References Cited

U.S. PATENT DOCUMENTS 4,247,855 A * 1/1981 Uede et al. ............... 345/36
4,500,953 A * 2/1985 Takezoe et al. ........... 714/49
4,763,248 A * 8/1988 Kitada ...................... 714/48
4,829,467 A * 5/1989 Ogata ....................... 710/244
4,862,409 A   8/1989 Nix
4,870,345 A * 9/1989 Tomioka et al. .......... 714/731
4,897,810 A * 1/1990 Nix .......................... 710/267
5,118,975 A * 6/1992 Hillis et al. ............... 327/158
5,652,836 A * 7/1997 Park ......................... 714/55
5,754,764 A * 5/1998 Davis et al. ............... 709/200
5,815,733 A * 9/1998 Anderson et al. ......... 710/48
5,822,557 A * 10/1998 Suetake et al. ........... 712/212
6,362,675 B1 * 3/2002 Alwais .................... 327/218
6,779,125 B1 * 8/2004 Haban ..................... 713/500

FOREIGN PATENT DOCUMENTS

| JP | 2-044428 | 2/1990 |
| JP | 7-056756 | 3/1995 |
| JP | 10-041804 | 2/1998 |
| JP | 10-240497 | 9/1998 |

OTHER PUBLICATIONS

"Flip-flop (electronics)", Wikipedia. org, <http://en.wikipedia.org.wiki/Flip-flop_(electronics)>, retrieved from the Internet on Apr. 27, 2006.*

* cited by examiner

Primary Examiner—Rehana Perveen
Assistant Examiner—Faisal Zaman
(74) Attorney, Agent, or Firm—Staas & Halsey LLP

(57) ABSTRACT

A state indicating information setting circuit and a status bit setting circuit are responsive to detection of a predetermined state by a predetermined state detecting part for setting predetermined state indicating information and, then, appropriately resetting the detection state in the state detecting part.

10 Claims, 14 Drawing Sheets

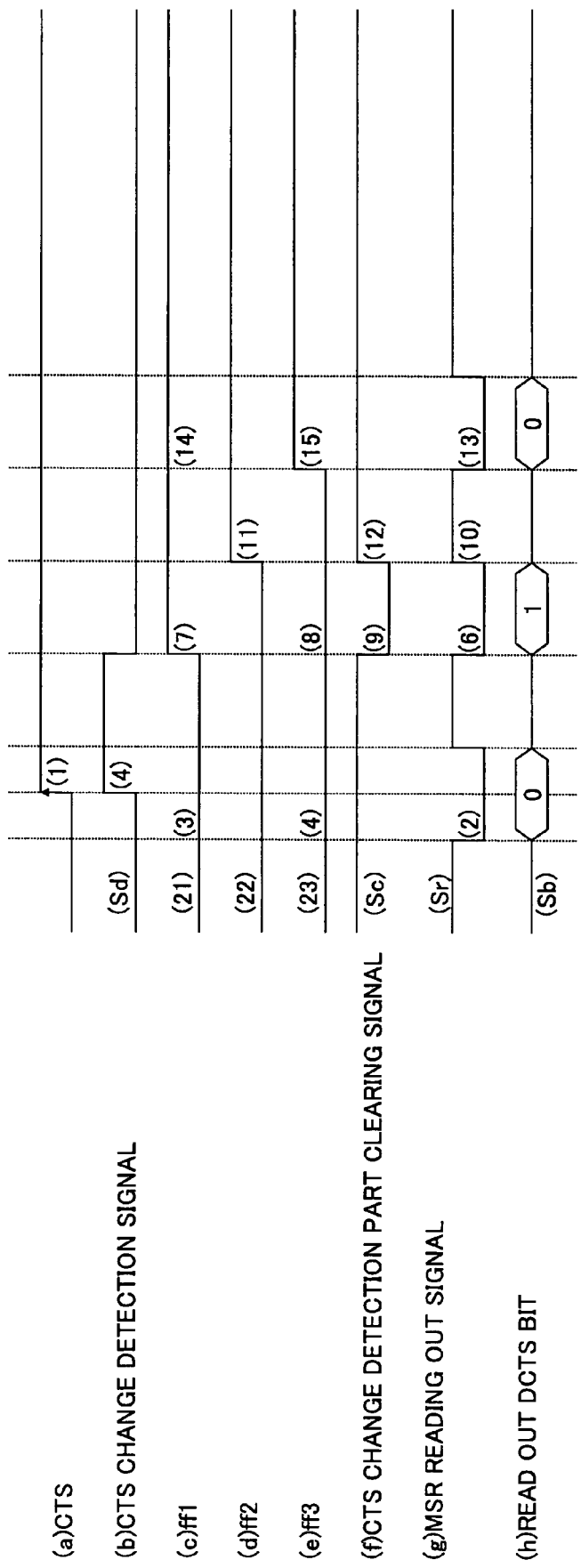

STATE INDICATING INFORMATION SETTING CIRCUIT AND STATUS BIT SETTING CIRCUIT

BACKGROUND OF THE INVENTION

1. Field of the Invention

The present invention relates to a state indicating information setting circuit and a status bit setting circuit, and, in particular, to a state indicating information setting circuit and a status bit setting circuit responsive to a detection of a predetermined state by a predetermined state detecting part for setting predetermined state indicating information and then appropriately resetting the detection state in the state detecting part.

2. Description of the Related Art

A so-called read register circuit is a register from which a CPU can read out predetermined information provided in a peripheral circuit of a so-called UART (universal asynchronous receiver-transmitter). A specific example thereof is a circuit which provides a DCTS (delta clear to send) bit for an MSR (modem status register) providing an I/O port of a well-known 16450/16550 type UART.

Such a read register circuit is responsive to a detection of a status in a predetermined status detection part, which status occurs in a relating circuit as a predetermined monitoring object, for taking this state, turning on a so-called DCTS bit as state indicting information and thus enabling reading out of the bit from the external CPU.

With regard to the read register circuit, if the DCTS bit were read out by the CPU again after being once read out by the same CPU, a recognition error would occur, which may result in a damage exerted in the system around the CPU. In order to avoid such a situation, it is necessary to appropriately clear the once occurring state in the above-mentioned status detecting part from which the DCTS bit originates, so as to prevent the same status information from being taken in by the read register circuit again after once the DCTS bit is turned on.

However, if the timing of the clearing of the state in the status detecting part were too early, i.e., if the clearing operation on the status detecting part occurred before the status is properly taken in by the read register circuit once, it would prevent the status from being properly taken in by the read register circuit. In such a case, the DCTS bit might not be turned on at worst as a result. Especially, high speed operation of a computer has been demanded recently, and as a result, the above-mentioned problem tends to be more serious.

The requirements which should be satisfied by the DCTS bit of the above-mentioned MSR, which is one example of the above-mentioned DCTS bit, are as follows:

1) the status, i.e., a change in a CTS (clear to send) line in this case is detected, and the bit is turned on to "1";

2) the bit is then turned off to "0" after the status is taken in with a predetermined register reading out signal, i.e., an MSR reading out signal in this example; and 3) even if the bit=1 cannot be read out by the register reading out signal in case the status signal changes during the reading out of the status with the register reading out signal, the bit=1 can be read out with the subsequent register reading out signal.

Japanese laid-open patent application No. H10-41804 for example discloses a method of clearing the status detection state for a read registrar circuit mentioned above. A configuration applying the method thus disclosed for clearing the status detection state after the status is read by the register reading signal as for an interface bit provided in an LSR (line status register), the above-mentioned MSR (modem status register) or so, for example, will now be discussed. In this case, same as the above, it is assumed that the bit satisfies the following requirements:

1) the bit is turned on to "1" (in other words, 'the bit is set') in response to a change in the input signal CTS (L→H, or H→L);

2) upon provision of the MSR reading out signal, the bit can be read out externally, i.e., by a CPU or the like;

3) upon provision of the MSR reading out signal, after the bit is read out externally once, the bit is turned off to "0" (i.e., 'the bit is cleared or cancelled') after the reading out; and 4) during provision of the MSR reading out signal, in case the input signal CTS changes, even when the bit=1 cannot be read out in the current reading out operation, the bit=1 can be read out in the subsequent reading out operation.

FIG. 1 shows a DCTS bit setting circuit configured applying the concept disclosed by the above-mentioned Japanese laid-open patent application No. H10-41804. FIG. 2 shows operation time chart in the circuit shown in FIG. 1. In the figures, 'ff1' and 'ff2' denote D-FFs (D-flip-flops), respectively. The operation of this circuit will now be described.

In FIG. 2, in Steps (1) through (9), DCTS bit=1 is read out with the MSR reading out signal after the input signal CTS changes, and DCTS bit=0 is read out with the subsequent MSR reading out signal. Further, in Steps (10) through (17), when the input signal CTS changes during provision of the MSR reading out signal, DCTS bit=0 is read out with this MSR reading out signal, and then, with the subsequent MSR reading out signal, DCTS bit=1 is read out. These operations will now be described specifically step by step.

In Step (1), the input signal CTS changes, and in Step (2), a one shot pulse generating circuit 10 detects this change in the CTS signal, and generates a one shot pulse. In Step (3), the one shot pulse resulting from the detection of the CTS change is input to an S input terminal of a flip-flop ff1, and as a result, ff1=H occurs. In Step (4), MSR reading out signal=L occurs, and in Step (5), a flip-flop ff2 responds thereto and takes in the value of ff1=H. As a result, during MSR reading out signal=L, a bus driver BS opens so that DCTS bit=1 (=ff2) is read out by a CPU (see FIG. 2, (f)).

In Step (6), ff1=L occurs due to a change of the MSR reading out signal into the L level. In Step (7), MSR reading out signal=H occurs, and then, in Step (8), when MSR reading out signal=L occurs, ff2 takes in the value of ff1=L due to the change of the MSR reading out signal into the L level in Step (9). As a result, the bus driver BS opens during MSR reading out signal=L, and DCTS bit=0 (=ff2) is read out (see FIG. 2, (f)). In Step (10), when MSR reading out signal=L occurs, in response thereto, in Step (11), ff2 takes in the value of ff1=L. As a result, also in this case, during MSR reading out signal=L, DCTS bit=0 (=ff2) is read out (see FIG. 2, (f)).

Then, when the input signal CTS changes in Step (12), the one shot pulse generating circuit 10 detects it in Step (13), and generates a one shot pulse. In Step (14), this is input to the S input terminal of ff1, and thus, ff1=H results. Then, in Step (15), MSR reading out signal=H occurs, and in Step (16), MSR reading out signal=L occurs. In response thereto, in Step (17), ff2 takes in the value of ff1=H. As a result, during MSR reading out signal=L, DCTS bit=1 (=ff2) is read out. Further, in Step (18), due to the change of the MSR reading out signal into the L level, ff1=L results.

FIG. 3 shows a circuit configuration of another example of a DCTS bit setting circuit for an MSR applying a concept disclosed by Japanese laid-open patent application No. H2-44428. FIG. 4 shows an operation time chart in this circuit. In these figures, 'ff1' and 'ff2' denote respective SR latch circuit devices, and 'ff3' denotes a D latch circuit device. Operations in the circuit are as follows:

In Steps (1) through (15) in FIG. 4, DCTS bit=1 is read out with an MSR reading out signal after a CTS line level acting as an input signal changes, and then, with the subsequent MSR reading out signal, DCTS bit=0 is read out. In Step (16) through (26), when the input signal CTS level changes during provision of the MSR reading out signal, DCTS bit=0 is read out at the time of provision of the MSR reading out signal, and then, upon the subsequent provision of the MSR reading out signal, DCTS bit=1 is read out. The respective steps will now be described step by step.

In Step (1), when the input signal CTS changes, a one shot pulse generating circuit 10 detects the change in the input signal CTS in Step (2), and outputs a CTS change detection result=H pulse. In Step (3), this signal is input to an S terminal of ff2, and ff2=H results. In Step (4), signal=L obtained from inverting the MSR reading out signal by a NOT circuit device 20 is input to a G terminal of ff3, so that ff3 opens, and thus, ff2=ff3=H results.

In Step (5), MSR reading out signal=L occurs, and as a result, the signal=H resulting from inversion of the MSR reading out signal by the NOT device 20 is input to the G terminal of ff3 so that ff3 opens in Step (6), and as a result, ff3 holds ff2=H. As a result, during the bus driver BD being opened due to the MSR reading out signal=L at this time, DCTS bit=1, i.e., the output of ff3 is read out (see FIG. 4, (h)).

In Step (7), MSR reading out signal=H is input to an S terminal of ff1, a signal=L resulting from inversion of the ff3 is input to an R terminal of ff1, and thus, ff1=H results. After that, in Step (8), MSR reading out signal=H occurs, and in Step (9), the signal=L resulting from inversion of this MSR reading out signal and the signal=L resulting from inversion of ff1 are input to an OR circuit device 30. As a result, DCTS bit clear signal=H occurs which is the output of the OR device 30.

In Step (10), the above-mentioned DCTS bit clear signal is input to the R terminal of ff2, and thus, ff2=L results. In Step (11), signal=L resulting from inversion of the MSR reading out signal is input to the G terminal of ff3, so that ff3 opens. As a result, ff3=ff2=L results. In Step (12), signal=H resulting from inversion of this ff3 is input to the R terminal of ff1, and thus, ff1=L results. Then, in Step (13), the signal L inverted from MSR reading out signal and the signal H inverted from ff1 are input to the OR device 30, and thus, DCTS bit clear signal=L results which is the output of the OR device 30.

Then, in Step (14), when MSR reading out signal=L occurs, signal=H inverted from this MSR reading out signal by the NOT device 20 is input to the G terminal of ff3 so that ff3 closes in Step (15), and thus ff3 holds ff2=L. As a result, during the BD being opened by the MSR reading out signal=L at this time, DCTS bit=0 (=ff3) is read out (see FIG. 4, (h)).

Then, in Step (16), when MSR reading out signal=L occurs, signal=H inverted from the MSR reading out signal is input to the G terminal of ff3, which causes the ff3 to close, and thus, the ff3 holds ff2=L in Step (17). As a result, the BD opens during MSR reading out signal=L at this time, and thus, DCTS bit=0 (=ff3) is read out (see FIG. 4, (h)).

Then, in Step (18), when the input signal CTS level changes, the one shot pulse generating circuit 10 detects this change in the input signal CTS in Step (19), and generates an H pulse as a CTS change detection result. In Step (20), the H pulse as the CTS change detection result is input to the S terminal of the ff2, which results in ff2=H. Then, in Step (21), MSR reading out signal=H occurs, and in Step (22), the inverted signal=L therefrom by the NOT device 20 is input to the G terminal of the ff3, which causes the ff3 to open, and thus, the ff3 takes in the value of ff2=H.

Then, in Step (23), MSR reading out signal=L occurs, inverted signal=H thereof is input to the G terminal of the ff3, which causes the ff3 to open, and thus, the ff3 holds the above-mentioned ff2=H. As a result, during the BD being opened due to MSR reading out signal=L at this time, DCTS bit=1 (=ff3) is read out.

Then, in Step (25), inverted signal=H from the above-mentioned MSR reading out signal is input to the S terminal of the ff1 and also inverted signal=L from the ff3 is input to the R terminal of the ff1, which results in ff1=H. Then, in Step (26), when MSR reading out signal=H occurs, inverted signal=L therefrom and inverted signal=L from the ff1 result in DCTS bit clear signal=H which is the inverted output of the OR device 30, in Step (27).

In Step (28), this DCTS bit clear signal is input to the R terminal of the ff2, which causes ff2=L, and in Step (29), inverted signal=L from the MSR reading out signal is input to the G terminal of the ff3, which opens the ff3, and thus, the ff3 takes in the value of ff2=L. Then, in Step (30), inverted output signal=H of the ff3 is input to the R terminal of the ff1, and thus, ff1=L results. Then, in Step (31), inverted signal=L of the MSR reading out signal and inverted signal=L of the ff1 cause DCTS bit clear signal=L which is the inverted output of the OR device.

Thus, in both the example of FIGS. 1 and 2 and the example of FIG. 3 and 4, in response to the change in the CTS line level (rising edge), the DCTS bit "1" is read out with an immediately coming L level of the MSR reading out signal, and then, the DCTS bit is returned to "0" with an immediately coming L level of the MSR reading out signal. Similarly, in response to the change in the CTS line level (decaying edge), the DCTS bit "1" is read out with an immediately coming L level of the MSR reading out signal, and then, the DCTS bit is returned to "0" with an immediately coming L level of the MSR reading out signal. Accordingly, the above-mentioned requirements for a DCTS bit are satisfied.

Further, other than the above-mentioned two prior art documents, Japanese laid-open patent applications Nos. H10-240497 and H07-56756 also disclose the background arts.

SUMMARY OF THE INVENTION

The above-mentioned examples are so-called level-detecting-type read clear DCTS bit circuits having a configuration in which a status detection signal is input to an asynchronous reset input terminal of a FF (flip-flop) device or a latch device. Therefore, in case the active interval of the status detection signal is longer than the active interval of the register reading out signal, there is a possibility that the status is read out twice or more even with only one occurrence of the detection signal. If such a phenomenon occurs, a CPU which reads out the status may malfunction, and as a result, the whole system around the CPU may be damaged. Such a situation in which the active interval of the status detection signal is longer than the active interval of the register reading out signal may occur as the period of the register reading out signal is reduced as a result of increase in the system operation speed, i.e., the operation clock rate. A condition of occurrence of such a problem will now be discussed in detail.

FIG. 5 shows an operation time chart assuming a case where, in the DCTS bit setting circuit described above with reference to FIG. 1, the one shot pulse generating circuit 10 is designed to generate a one shot pulse which has an interval longer than the interval of the L level of the MSR reading out signal. In this case, specific operations occurring are as follows:

First, in Step (1) in FIG. 5, when the input CTS signal changes, the one shot pulse generating circuit 10 detects this change in the input signal CTS in Step (2) so as to generate an H pulse as the CTS change detection result. In Step (3), this H pulse as the CTS change detection result is input to the S terminal of ff1, which causes ff1=H. Then, in Step (4), when MSR reading out signal=L occurs, this change in the MSR reading out signal into the L level causes ff2 to take in the value of ff1=H in Step (5). As a result, DCTS bit=1 (=ff2) can be read out during MSR reading out signal=L at this time (see FIG. 5, (f)).

Then, in Step (6), the change in the MSR reading out signal into the L level does not cause ff1=L, but ff1=H is maintained since the H pulse as the CTS change detection result is kept being input to the S terminal of ff1 in this case, different from the case of FIG. 2. This operation result means that clearing of the DCTS bit even after the reading out with the MSR reading out signal results in failure. Then, as in Step (7), MSR reading out signal=H occurs, and then, in Step (8), MSR reading out signal=L occurs again, this change in the MSR reading out signal into L level causes ff2 to hold the immediately antecedent ff1=H in Step (9). As a result, during MSR reading out signal=L at this time, DCTS bit=1 (=ff2) is again read out.

FIG. 6 shows an operation time chart assuming a case where, in the DCTS bit setting circuit described above with reference to FIG. 3, the one shot pulse generating circuit 10 is designed to generate a one shot pulse which has an interval longer than the interval of the L level of the MSR reading out signal. In this case, specific operations occurring there are as follows:

In Step (1), upon change in the input signal CTS, the one shot pulse generating circuit 10 detects this change in the input signal CTS in Step (2) and generates an H pulse as the CTS change detection result. In Step (3), this H pulse as the CTS change detection result is input to the S terminal of ff2, which causes ff2=H. Then in Step (4), the inverted signal=L of the MSR reading out signal via the NOT device 20 is input to the G terminal of ff3, which opens ff3, and thus, ff3 takes in the value of ff2=H.

Then, in Step (5), when the MSR reading out signal=L occurs, the inverted signal=H of this MSR reading out signal via the NOT device 20 is input to the G terminal of ff3, which closes ff3, and thus, ff3 holds ff2=H in Step (6). As a result, during MSR reading out signal=L at this time, DCTS bit=1 (=ff3) is read out.

Then, in Step (7), the inverted signal=H of the MSR reading out signal is input to the S terminal of ff1 and the inverted signal=L of ff3 is input to the R terminal of ff1 which cause ff1=H. Then, in Step (8), when MSR reading out signal=H occurs, the inverted signal=L of this MSR reading out signal and the inverted signal=L of ff1 cause DCTS bit clear signal=H which is the inverted output signal of the OR device 30, in Step (9).

Then, in Step (10), this DCTS bit clear signal is input to the R terminal of ff2, which causes ff2=L, and in Step (11), the inverted signal=L of the above-mentioned MSR reading out signal is input to the G terminal of ff3, which opens ff3. Thereby, ff3 takes in the above-mentioned value of ff2=L. Then, in Step (12), the inverted output signal=H of ff2 is input to the R terminal of ff1, which causes ff1=L. As a result, in Step (13), the inverted signal L of the above-mentioned MSR reading out signal and the inverted output signal=H of ff1 cause DCTS bit clear signal=L which is the inverted output of the OR device 30.

Then, in this case, in Step (14), the H pulse as the CTS change detection result is kept being input to the S terminal of ff2, which results in ff2=H being kept unchanged. In other words, this fact means that clearing of the DCTS bit even after the MSR reading out thereof results in failure.

Then, in Step (15), the inverted signal=L of the above-mentioned MSR reading out signal is input to the G terminal of ff3, which is thereby opened, and thus, ff2 again takes in the value of ff2=H. As a result, then, in Step (16), when MSR reading out signal=L occurs, the inverted signal=H of this MSR reading out signal is input to the G terminal of ff3 which is thus closed, and thus, ff3 holds the value of ff2=H. Thereby, during MSR reading out signal=L at this time, DCTS bit=1 (=ff3) is again read out.

The present invention has been devised in consideration of the above-mentioned problem, and an object of the present invention is to provide a state indicating information setting circuit in which, even when it is difficult to appropriately reduce the active interval of the detection signal while the circuit operation speed is increased along with increase in operation speed of a semiconductor circuit such as an LSI circuit or so, the status detection state can be positively reset, and thus, the status bit can be prevented from being read bout again while reading out of the status bit once can be achieved positively.

According to the present invention, a state indicating information setting circuit includes: a first state holding part inputting thereto a signal indicating either a predetermined first state or a predetermined second state, holding the state indicated by the signal input and outputting the state; a second state holding part for inputting thereto the signal output from the first state holding part, holding the state indicated by the signal input and outputting the state; a first state comparing part inputting thereto a predetermined state detecting signal and the signal output from the second state holding part, and outputting a signal indicating the predetermined first state to the first state holding part when the respective states indicated by the respective signals input are different from one another, and outputting a signal indicating the predetermined second state when these states of the input signals are same as one another; a second state comparing part comparing the states of the respective signals output from the first state holding part and the second state holding part, and outputting a signal indicating the predetermined second state as a state detection signal clearing signal when the respective states indicated by the input signals are different from one another; and a third state comparing part comparing the states of the respective signals output from the first state holding part and the second state holding part, outputting a state detection signal indicating the predetermined first state when the states of the respective signals input are different from one another, and outputting the state non-detection signal indicating the predetermined second state when the states of the input signals are same as one another.

In this configuration, the first comparing part outputs an opposite state from the output state of the second state holding part each time of status detection, and the output state is taken in by the first state holding part which then inverts the own state. Then, this inverted state is received by the second state holding part which then further inverts the own state. Then, the second comparing part detects a difference in the state between the first and second state holding parts which occurs when the second state holding part has not yet inverted the own state after the first state holding part has already inverted the own state, and then, the second comparing part generates the status reset signal. Similarly, the third comparing part detects a difference in the state between the first and second state holding parts which occurs when the second state holding part has not yet inverted the own state after the first state holding part has already inverted the own state, and then, the third comparing part generates the status bit which can be externally read out.

Thus, according to the present invention, the first and second state holding parts invert the respective own states in sequence upon detection of the given status, and, during this operation, setting of the status detection state and also reset of this status detection state are caused by the state in which the first state holding part has been already inverted while the second state holding part has not been inverted yet. Thus, by applying the inverting operations of the state holding parts into setting and resetting of the status detection state, it is possible to utilize both the respective state transitions (respective inversions), i.e., L→H and H→L. As a result, it is possible to immediately respond to the status detection input and move to the status detection recognition state. As a result, it is possible to relatively widen the interval during which a CPU can read out the status stably, and simultaneously, it is possible to rapidly recognize the status detection state and then to reset the status detection state at an early timing after that. Accordingly, it is possible to effectively avoid a situation in which the same status is again read out.

Furthermore, it is preferable to further provide a third state holding part for further generating a delay in state inversion, and then, to set the status detection state by detecting a difference in the state between the first and third state holding parts. Thereby, it becomes possible to further stably provide the status detection state, and thus, reading out of the status bit by the CPU can be secured more positively.

According to the present invention, respective ones of both directions of inverting operations of the state holding parts such as flip-flops or so can be utilized effectively, a transient state in propagation of the inverting operation is detected so as to set the state indicating information, and also, a transition from the transient state into the steady state is detected so that the state detection signal is cleared. Thereby, it is possible to positively set the state indicating information and after that to rapidly clear the state detection signal, simultaneously. As a result, it is possible to achieve, even with a relatively simple configuration, high operation reliability. Also, this invention can be wildly applied to various types of LSI technologies including an ASIC. Further, it is possible to provide a circuit configuration which includes no obstruction in introducing a circuit designing manner applying a hardware designing language such as a VHDL, Verilog HDL, or so.

BRIEF DESCRIPTION OF DRAWINGS

Other objects and further features of the present invention will become more apparent from the following detailed description when read in conjunction with the accompanying drawings:

FIGS. 14 and 15 show time charts of operation in the circuit configuration shown in FIG. 13.

DETAILED DESCRIPTION OF THE PREFERRED EMBODIMENT

With reference to figures, an embodiment of the present invention will be described.

First of all, a process of reaching the philosophy of the present invention will now be described. A countermeasure against the above-mentioned issue in which the same status is read out again by a CPU during an active time interval of a status detection signal in case where shortening of the active time interval of the status detecting signal is difficult with respect to desired improvement in the operation rate of a relevant semiconductor circuit will now be discussed.

In order to solve this issue, the following two methods can be considered. That is, a first method is to make the active time interval of the detection signal shorter than the active time interval of the register reading out signal; and a second method is not to apply level detection on the detection signal (i.e., not to employ a method of receiving a signal at the asynchronous input terminal of a FF device or latch device as mentioned above), but to detect an edge of the detection signal by applying the detection signal rather to the clock input terminal of the FF device instead.

Figure 1:
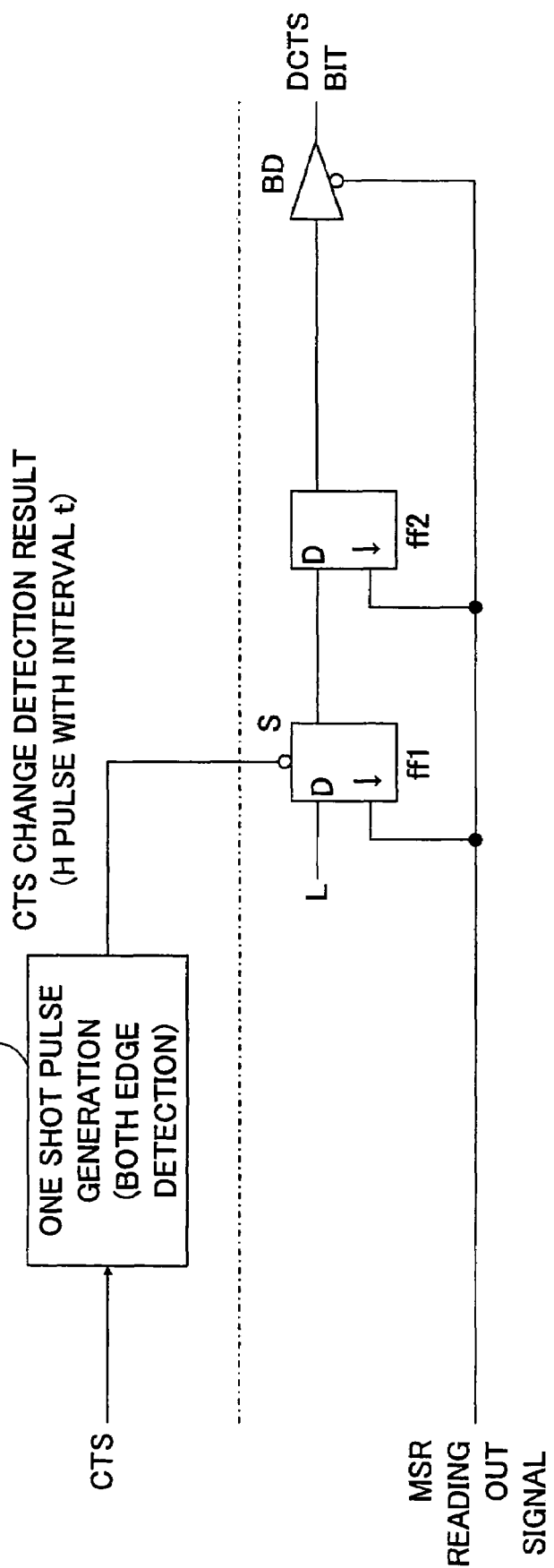
FIG. 1 shows a configuration of a DCTS bit circuit for an MSR in one example of the related art.
Figure 2:
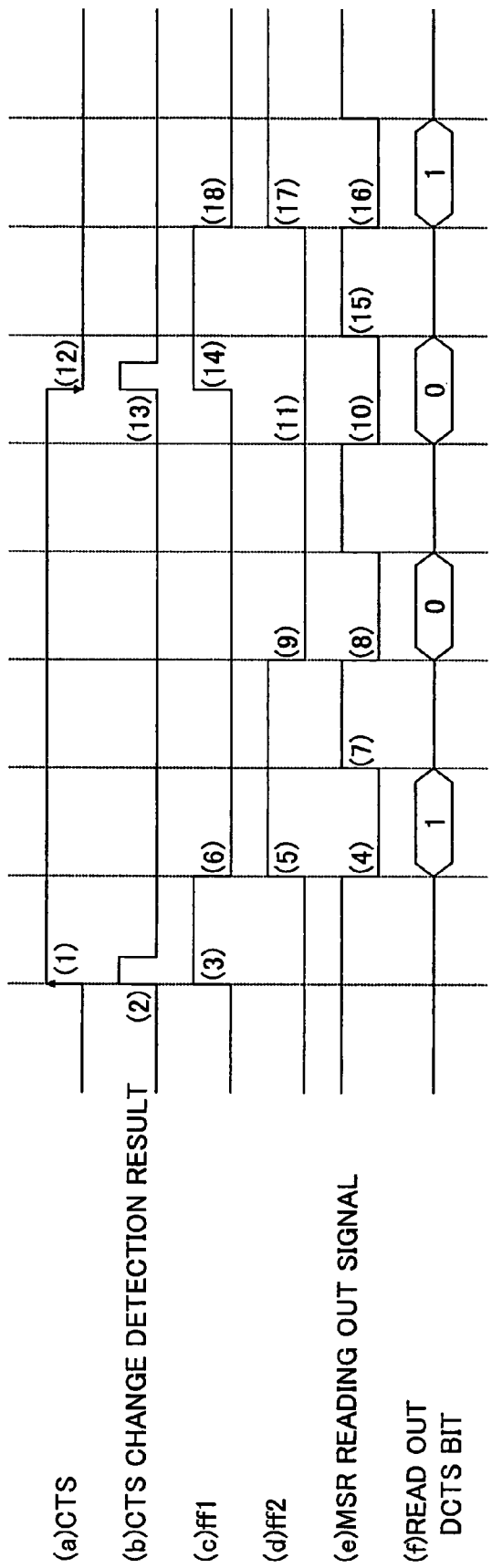
FIG. 2 shows a time chart of an operation of the circuit configuration shown in FIG. 1.
Figure 3:
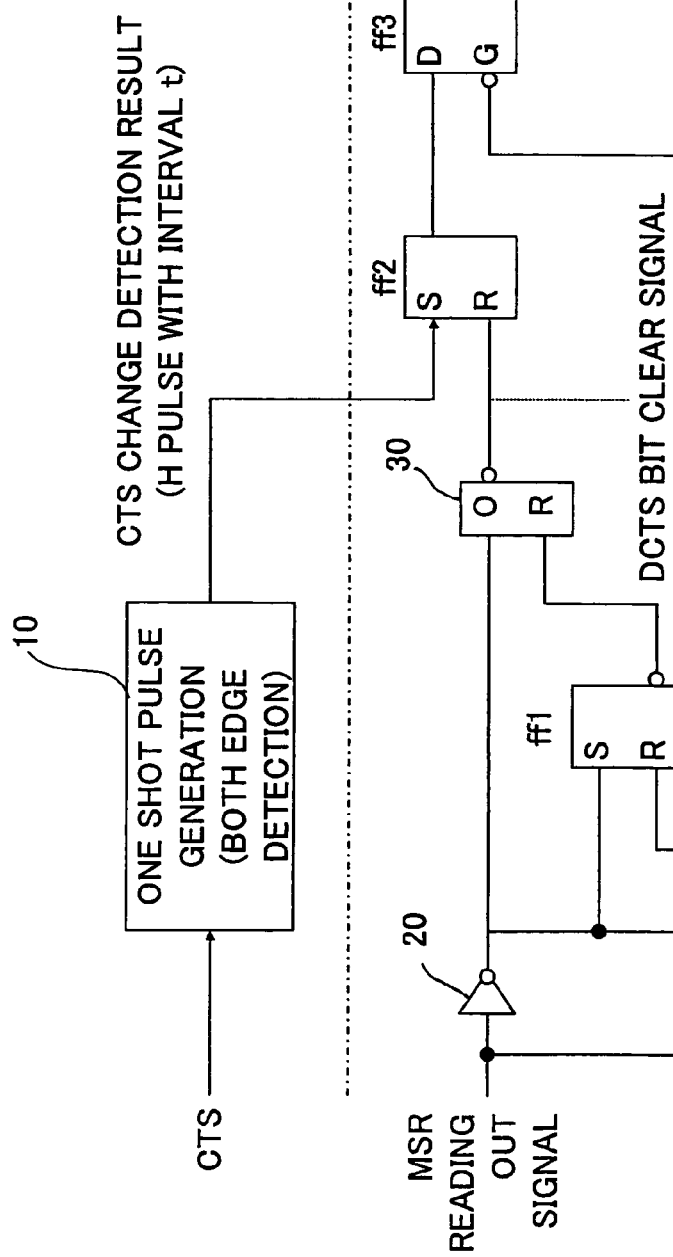
FIG. 3 shows a configuration of a DCTS bit circuit for an MSR in another example of the related art.
Figure 4:
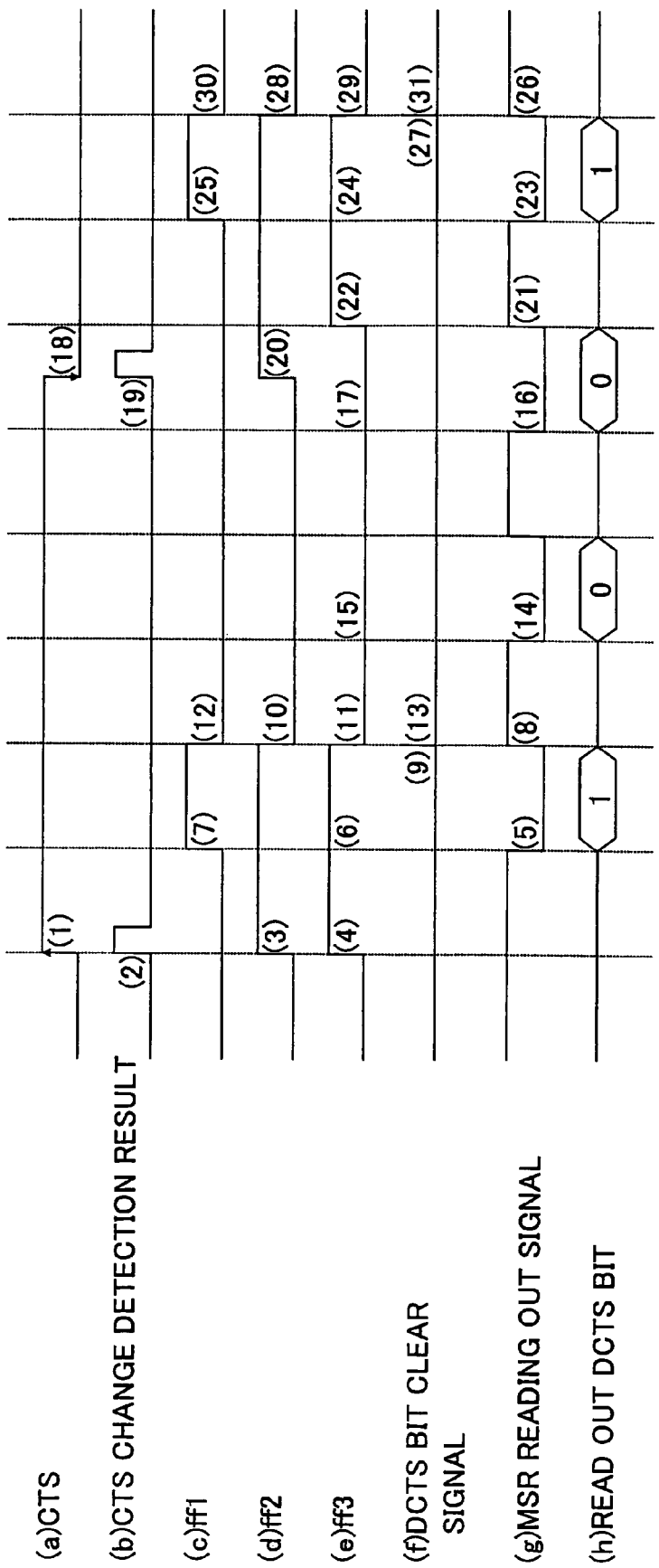
FIG. 4 shows a time chart of an operation of the circuit configuration shown in FIG. 3.
Figure 5:
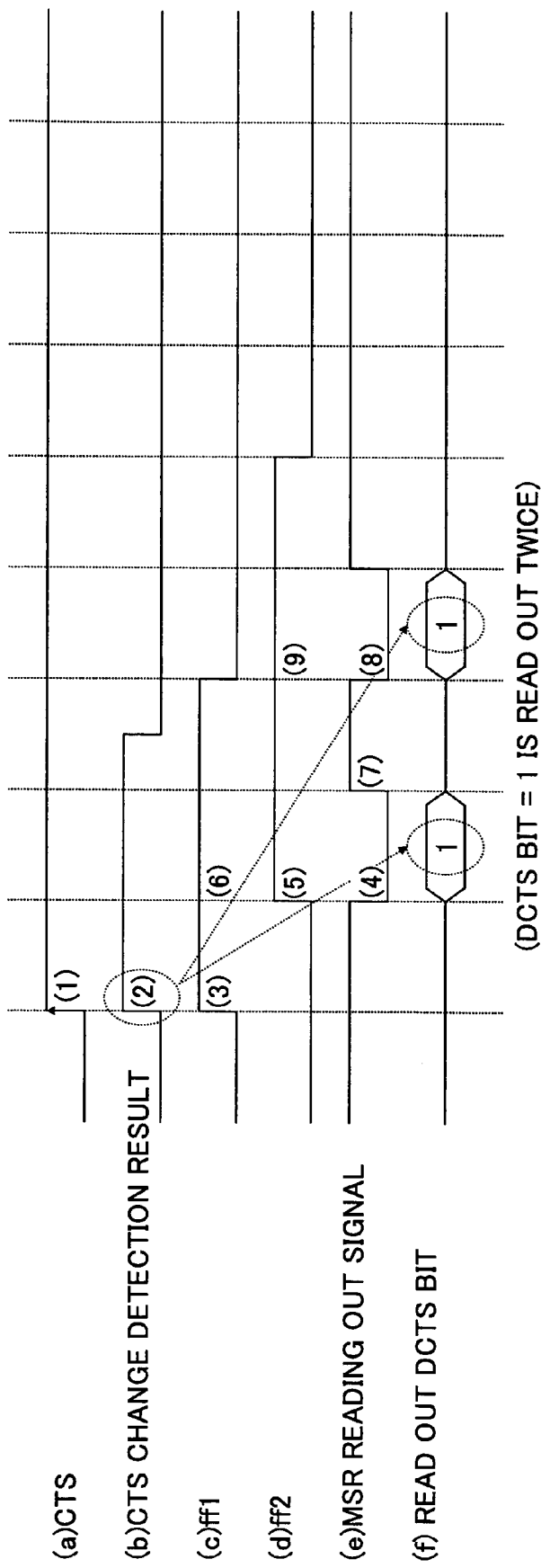
FIG. 5 shows a time chart of an operation of the circuit configuration shown in FIG. 1 in which the designing condition is changed.
Figure 6:
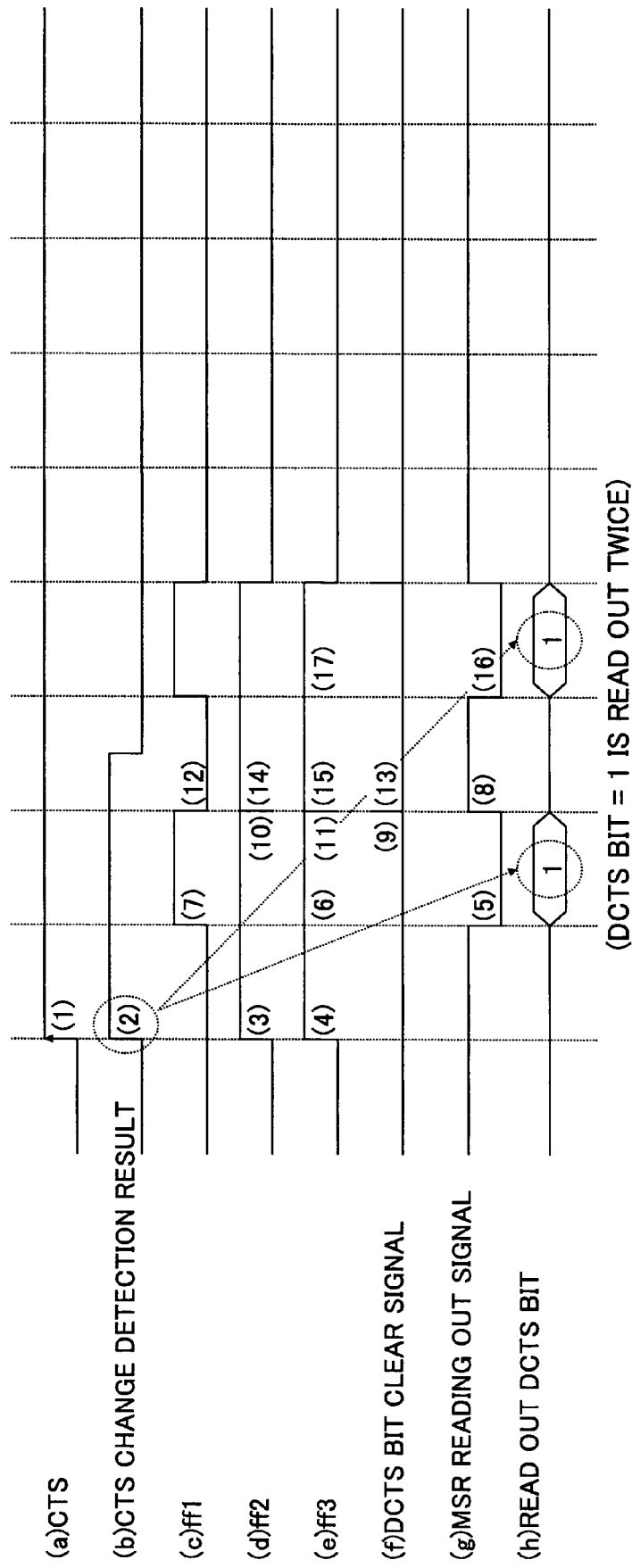
FIG. 6 shows a time chart of an operation of the circuit configuration shown in FIG. 3 in which the designing condition is changed.
Figure 7:
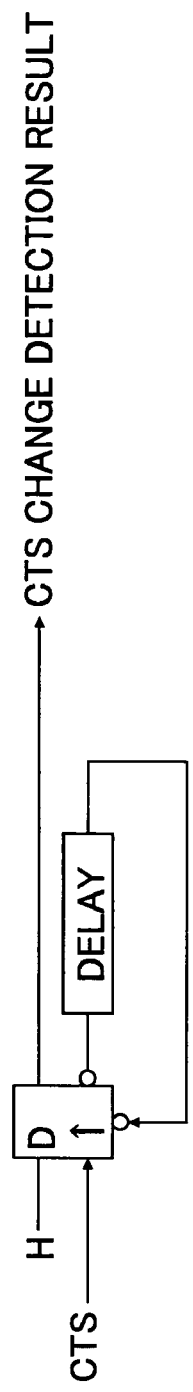
FIGS. 7 and 8 show examples of configuration for shortening the pulse width generated by one shot generating circuits shown in FIG. 1 and 3, respectively.
Figure 8:
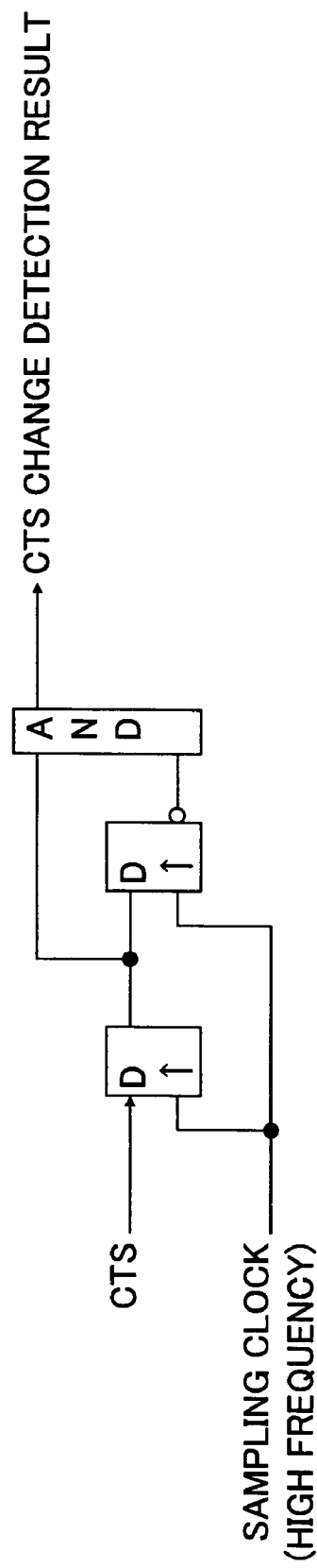

In order to employ the above-mentioned first method, it is necessary to shorten the pulse width output from the one shot pulse generating circuit 10 in the circuit configuration examples shown in FIG. 1 or 3. FIGS. 7 and 8 illustrate configuration examples for this purpose. FIG. 7 shows a case where in the circuits shown in FIGS. 1 and 3, the one shot pulse generating circuit 10 is designed assuming that a separate clock signal is not introduced by the one shot pulse generating circuit 10. FIG. 8 shows a case where in the circuits shown in FIGS. 1 and 3, the one shot pulse generating circuit 10 is designed assuming that a separate clock signal is introduced by the one shot pulse generating circuit 10. In case where the configuration shown in FIG. 7 is employed, it is needed to shorten a delay time in a delay device shown. However, it is difficult to achieve this at a high accuracy. In case of employing the configuration shown in FIG. 8, it is needed to increase the frequency of a sampling clock signal shown to be introduced. However, for this purpose, it is necessary to separately provide a high-frequency clock signal, and this may complicate the total circuit configuration.

The above-mentioned second method will now be discussed. The second method is not based on the logic of setting the status bit by detecting the level of the detection signal, specifically, not based on the method of receiving the detection signal at the asynchronous input terminal of an FF device or a latch device in the above-mentioned example to set the status bit. Instead, a logic is employed in which, for example, by applying a circuit configuration in which the detection signal is provided to the clock input terminal of an FF device or so, the rising edge of the detecting signal is detected, and thereby the status bit is set.

Figure 9:
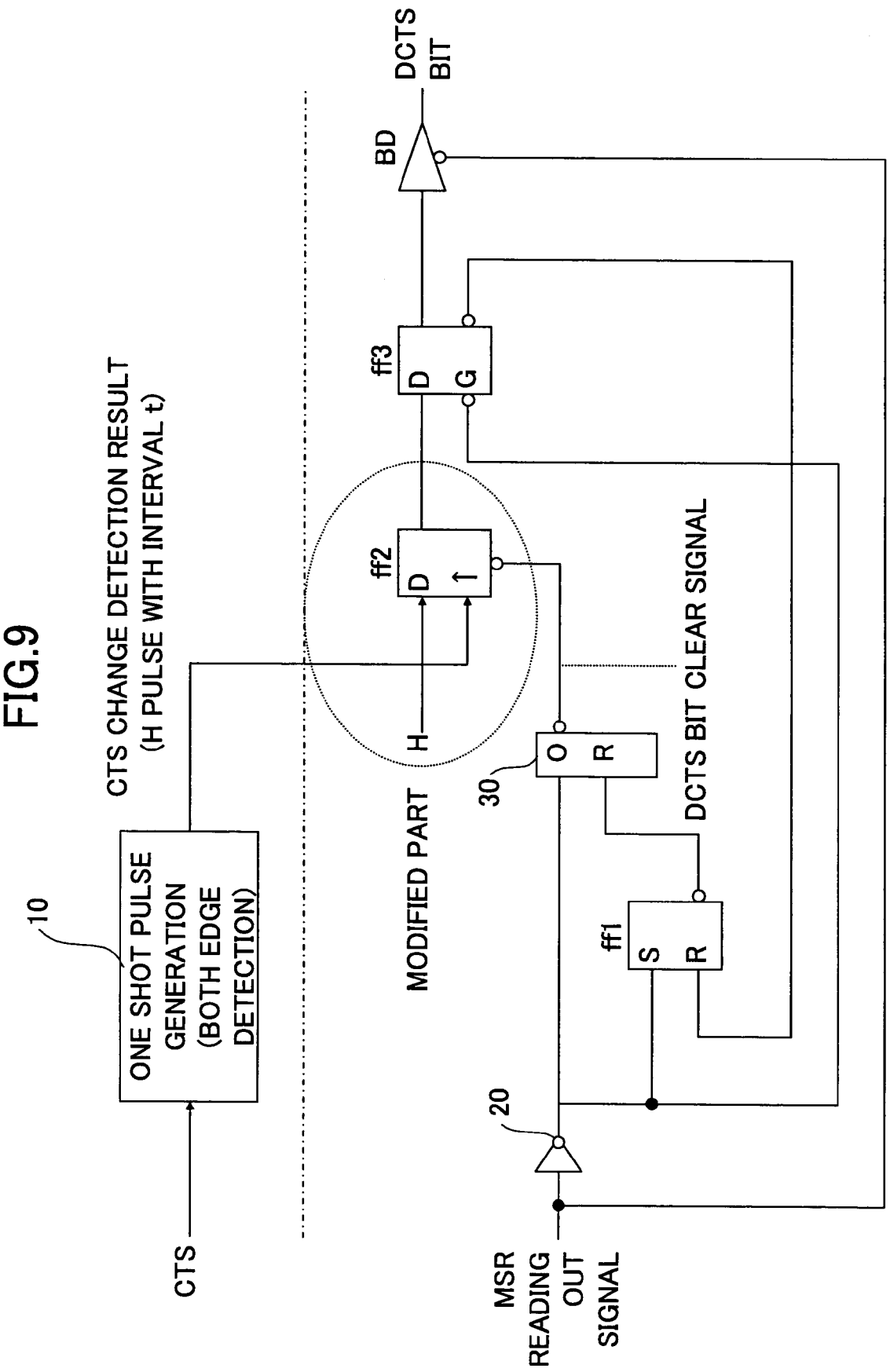
FIG. 9 shows a circuit configuration modified so as to apply a signal detection method employing edge detection to the configuration shown in FIG. 3.

In case of considering this method employing the edge detection logic, 'the bit clearing operation' with a use of 'the bit clear signal' which performs a feedback operation of the status bit setting state is not applied in the circuit configuration shown in FIG. 1, and thus, it is difficult to apply the above-mentioned method to the circuit configuration of FIG. 1. On the other hand, in a case of the circuit configuration shown in FIG. 3, the above-mentioned method can be applied merely by changing the SR latch device into a D-FF device for the ff2. FIG. 9 shows this case.

In the case of the circuit configuration example shown in FIG. 9, by providing the bit clear signal made of the inverted output of the OR device 30 to the reset terminal of the ff3, 'the status detection state' in the ff3 is provided in a feedback manner as 'the bit clear signal', and thereby, the ff2 is reset. As a result, even the pulse output from the one shot pulse generating circuit 10 is in the H state, the ff2 is reset. Accordingly, the above-mentioned issue of one status being read out twice is solved. In case of this circuit configuration, the state H is taken in by the input terminal of the ff2 and thus the ff2 is set when the CTS level become H again after it become L after that. Thereby, subsequent status detection after the above-mentioned resetting of the ff2 can also be achieved without problem.

However, when any of the above-mentioned first and second methods is applied, a problem may occur in terms of an ASIC design rule, a limitation needed for omitting the adjustment work for each ASIC or so. That is, in almost all manufacturers for ASICs, there is a tendency in which a circuit designing method in an extremely analog manner in which a pulse is generated with a use of a so-called gate array, or so is not applied due to a design philosophy based on easiness of product testing recently. In other words, in case of circuit configuration example shown in FIG. 7, a pulse is generated with a use of a gate array, and thus, it is difficult to apply this manner to an ASIC deign. Furthermore, the active time interval, i.e., the time interval of the H level in 'the bit clear signal' in the configuration example of FIG. 3 or 9 is created by a gate delay substantially. Accordingly, it is also problematic to apply this manner to the ASIC deign as mentioned above. Furthermore, if such a design manner is applied to the ASIC deign, a fine adjustment in the above-mentioned active time interval is needed for each particular type of ASIC, and thus, the manufacture process is complicated, which rises the product unit price.

Further, recently, circuit design with a use of a hardware designing language such as a VHDL, a Verilog HDL or so has been prevailing. In case of applying a designing way employing such a designing language, it is possible to achieve a designing manner in which design is made with estimating as to how much a delay occurs in a relevant circuit when design information in a form of the designing language is converted into an actual circuit configuration. However, ordinarily, a designing way of intentionally applying a delay itself initially in a circuit design is not employed in general. Accordingly, a circuit design assuming an application of a so-called gate delay such as that described above with reference to FIG. 3 or 9 is not preferable.

Then, as a result of further studying for achieving a circuit configuration providing a state indicating information setting circuit positively satisfying the predetermined requirements for a DCTS bit for an MSR or so with a relatively simple configuration avoiding application of a predetermined delay or a high speed clock signal for which a precise adjustment is difficult and also without applying a circuit designing manner assuming a so-called gate delay, the basic concept of the present invention has been reached.

Figure 10:
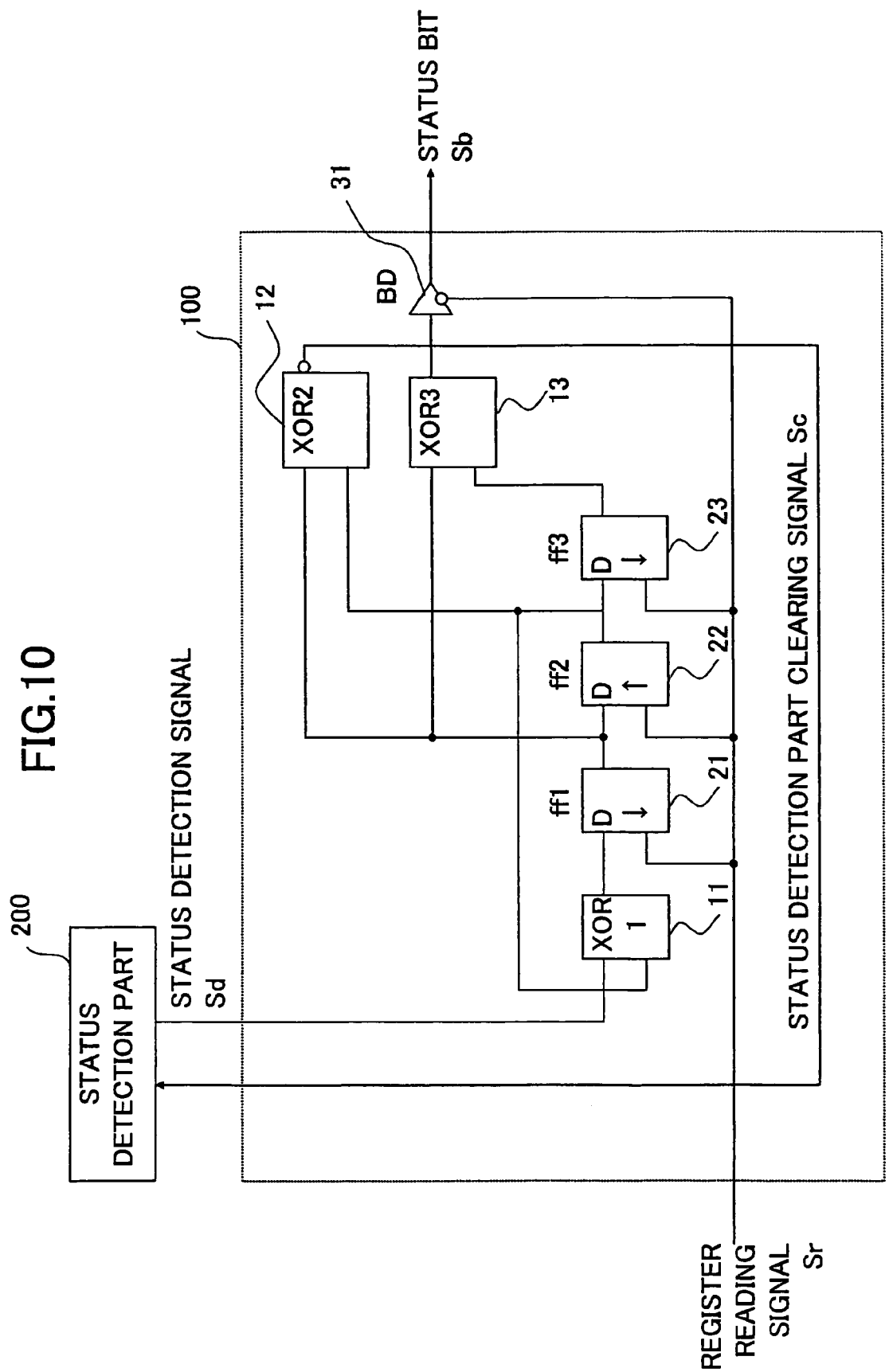
FIG. 10 shows a configuration of a read clearing status bit circuit in one embodiment of the present invention.

FIG. 10 shows a configuration of a read-clear-type status bit circuit 100 in an embodiment of the present invention. As shown, the read-clear-type status bit circuit 100 according to the embodiment includes an exclusive-OR circuit 11 which receives a status detection signal Sd from an external status detecting part 200, a D-flip-flop circuit device 21 which receives an output of the exclusive-OR circuit 11, a D-flip-flop circuit device 22 which receives an output of the D-flip-flop circuit device 21, a D-flip-flop circuit device 23 which receives an output of the D-flip-flop circuit device 22, an exclusive-OR circuit device 12 which receives outputs of these D-flip-flop circuit devices 22 and 23, an exclusive-OR circuit device 13 which receives outputs of the D-flip-flop circuit devices 21 and 23, and a bus driver 31 which receives an output of the exclusive-OR circuit 13 and outputs a status bit signal Sb.

The above-mentioned exclusive-OR circuit device 11 receives the status detection signal Sd externally and the output of the D-flip-flop circuit device 22, and outputs an exclusive-OR operation result of both of these signals. The D-flip-flop circuit device 21 receives this output at a D-terminal thereof, takes therein upon a decaying edge of a register reading out signal Sr provided thereto externally, and outputs the taken value. The D-flip-flop circuit device 22 receives this output at a D-terminal thereof, takes therein upon a rising edge of the register reading out signal Sr provided thereto externally, and outputs the taken value. The D-flip-flop circuit device 23 receives this output at a D-terminal thereof, takes therein upon the decaying edge of the register reading out signal Sr provided thereto externally, and outputs the taken value.

The exclusive-OR circuit device 12 receives the respective outputs of the D-flip-flop circuits 21 and 22, and provides a signal obtained from inverting the exclusive-OR operation result of both the signals, to an external status detection part 200 as a status detecting part clearing signal Sc. When receiving an L level of this status detecting part clearing signal Sc, the status detecting part 200 cancels a status detecting state in its own, and thus, cancels a once-generating status detection signal Sd. In other words, an H level of the status detection signal Sd is returned into an L level thereby.

The exclusive-OR circuit device 13 receives the respective outputs of the D-flip-flop circuit devices 21 and 23, and outputs a signal having a level obtained as a result of the exclusive-OR operation of both the outputs, to the bus driver 31. The bus driver 31 receives this signal, and outputs it as the status bit signal Sb during an L level of the above-mentioned register reading out signal Sr applied thereto. During an interval in which the register reading out signal Sr has an H level, the output thereof is kept in a high impedance state, and thus the signal level thereof is in an 'indefinite' state. A signal on the output terminal of this bus driver 31 is read out as a status bit by an external CPU or so.

Figure 11:
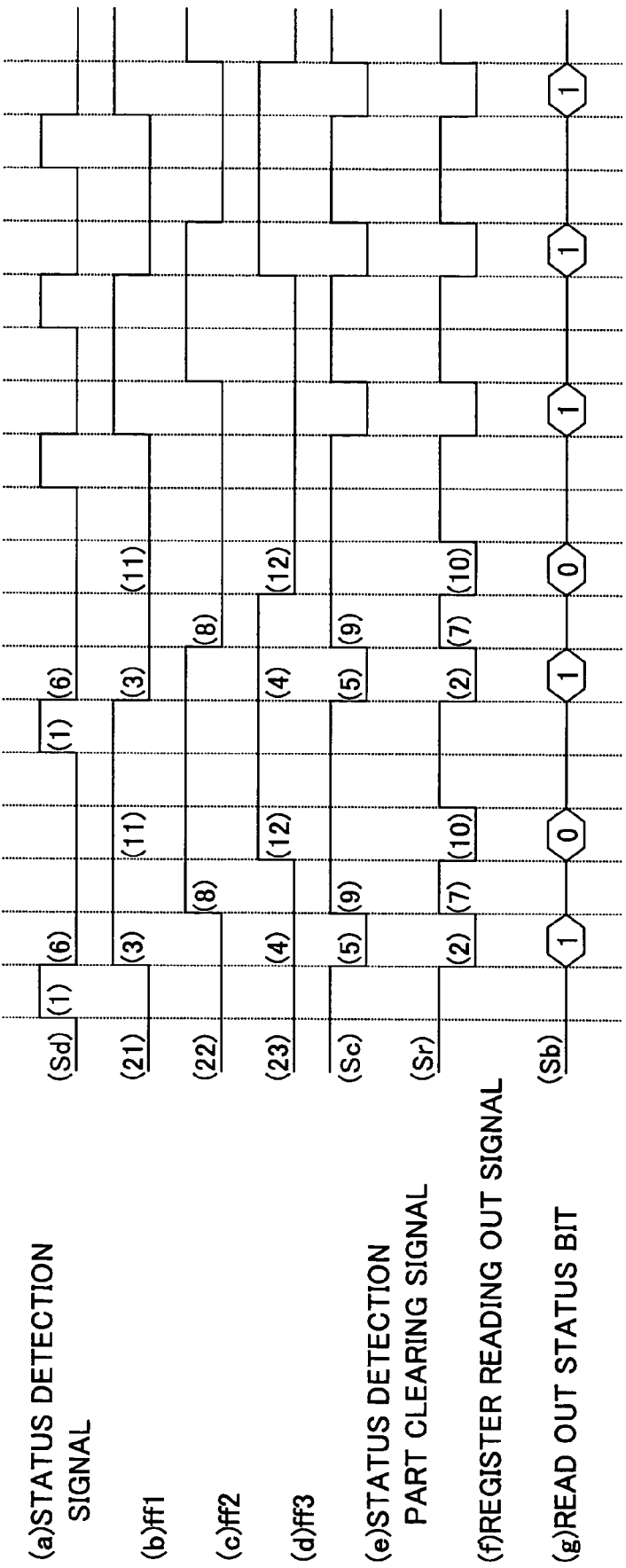
FIGS. 11 and 12 show time charts of operation in the circuit configuration shown in FIG. 10.
Figure 12:
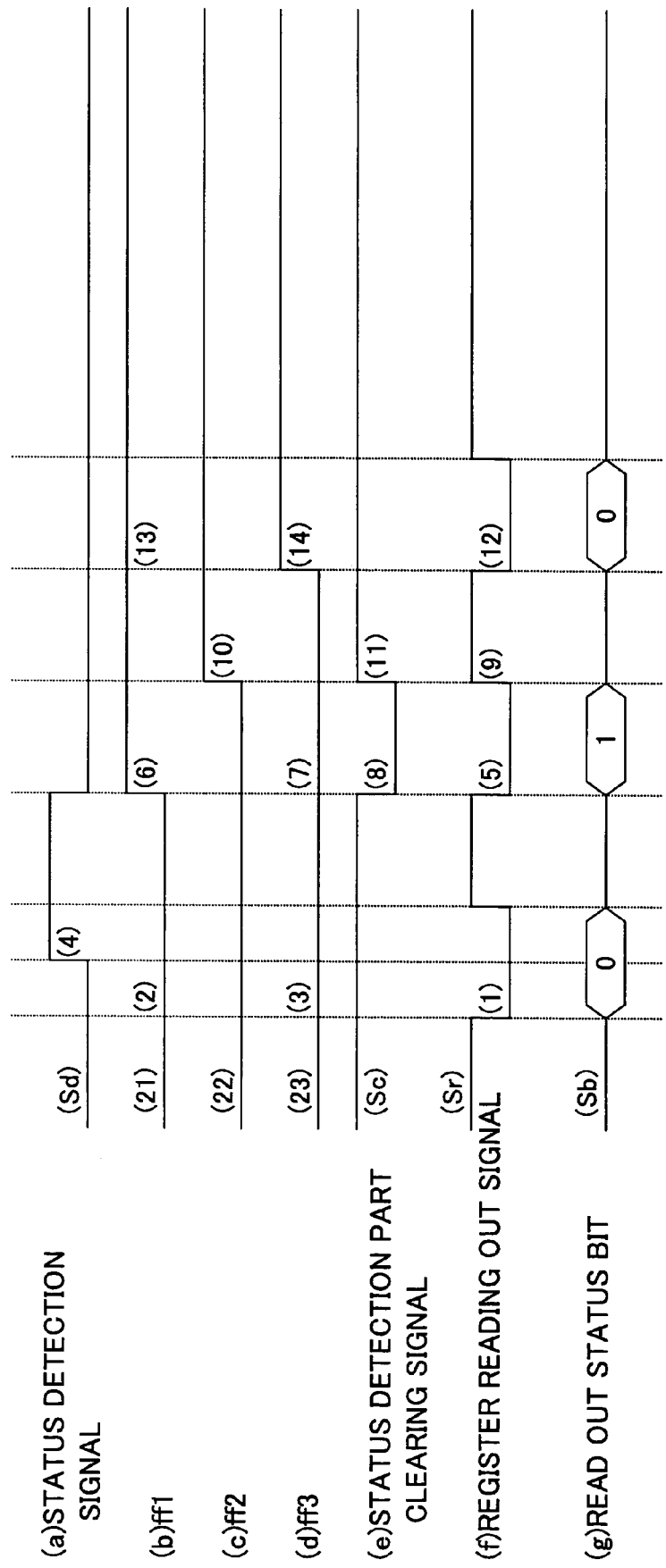

FIGS. 11 and 12 show timing charts illustrating operation in the above-mentioned circuit. FIG. 11 illustrates operation in which a predetermined status occurs during an interval other than an interval in which the register reading out signal Sr has the L level. FIG. 12 illustrates operation in which the predetermined status occurs during the interval in which the register reading out signal Sr has the L level.

Respective operation steps will now be described in detail. In FIG. 11, each of the D-flip-flop circuit devices 21, 22 and 23 has an L level output initially. Then, in Step (1) (the left side one in FIG. 11, the same manner is applied hereinafter), the status detecting part 200 detects the predetermined status, and as a result, the status detection signal Sd=H results. As a result, the exclusive-OR circuit device 11 outputs an H level by receiving the H level of the status detection signal Sd and the L level output of the D-flip-flop circuit device 22. Then, in Step (2), the register reading out signal Sr=L occurs. In Step (3), the change in the register reading out signal into the L level causes the D-flip-flop circuit device 21 to take in the above-mentioned H output of the exclusive-OR circuit device 11.

In Step (4), with the above-mentioned change in the register reading out signal into the L level, the D-flip-flop circuit device 23 takes in the above-mentioned L output of the D-flip-flop circuit device 22. As a result, the D-flip-flop circuit device outputs the L level. Thereby, the excusive-OR circuit device 13 outputs an H level from the H level and the L level output from the respective D-flip-flop circuit devices 21 and 23. This H level is output during the L level of the register reading out signal Sr via the bus driver 31, and is read out as a status bit of "1" by the external CPU or so (see (g) of FIG. 11). When this read-clear-type status bit circuit 100 is applied as the above-mentioned circuit for setting a DCTS bit for an MSR, the above-mentioned "1" is read out as the DCTS bit.

Then, in Step (5), with the H level and the L level output by these two flip-flop circuit devices 21 and 22, the exclusive-OR circuit device 12 outputs an L level which is an inverted value of the exclusive-OR operation thereon, as the status detecting part clearing signal Sc. In Step (6), this signal is received by the external status detecting part 200, which then returns according to this L level of the status detecting part clearing signal Sc the status detection signal which was once generated in the H level into the L level.

In Step (7), the register reading out signal returns into the L level, and in Step (8), responding thereto, the D-flip-flop circuit device 22 takes in the H level output from the D-flip-flop circuit device 21. In Step (9), the exclusive-OR circuit device 12 receives the H levels of both the two D-flip-flop circuit devices 21 and 22, and outputs the H level which is an inverted value of the L level which is the exclusive-OR operation result thereon. As a result, the status detecting part clearing signal returns into the H level which corresponds to an inactive state.

In Step (10), when the register reading out signal comes to have the L level again, the D-flip-flop circuit devices 21 responds thereto in Step (11) so as to take in the output of the exclusive-OR circuit device 11. In this case, the status detection signal already returns into the L level as mentioned above, while the D-flip-flop circuit device 22 outputs the H level, and thus, the signal thus taken in by D-flip-flop circuit device 21 from the exclusive-OR circuit device 11 has the H level which is the exclusive-OR operation result thereof. Then, in Step (12), the above-mentioned change in the register reading out signal into the L level causes the D-flip-flop circuit device 23 to take in the H level output from the D-flip-flop circuit device 22, and outputs the H level. As a result, the exclusive-OR circuit device 13 outputs the L level which is the exclusive-OR operation result of the above-mentioned H level output and the H level output of the D-flip-flop circuit device 21.

This output is read out as the status bit "0" via the bus driver 31 during the L level of the register reading out signal (see (g) of FIG. 11). Same as the above mention, when this read-clear-type status bit circuit 100 is applied as the above-mentioned circuit for setting a DCTS bit for an MSR, the above-mentioned "0" is read out as the DCTS bit.

Similarly, on the right side of FIG. 11, in other words, after Step (10) on the left side described above, each of the respective D-flip-flop circuit devices 21, 22 and 23 outputs the H level first. Then, in Step (1) (on the right side, the same manner is applied hereinafter), the status detecting part 200 detects the predetermined status, and as a result, the status detection signal Sd=H results. As a result, the exclusive-OR circuit device 11 outputs an L level by receiving the H level of the status detection signal Sd and the H level output of the D-flip-flop circuit device 22. Then, in Step (2), the register reading out signal Sr=L occurs. In Step (3), the change in the register reading out signal into the L level causes the D-flip-flop circuit device 21 to take in the above-mentioned L output of the exclusive-OR circuit device 11.

In Step (4), with the above-mentioned change in the register reading out signal into the L level, the D-flip-flop circuit device 23 takes in the above-mentioned H output of the D-flip-flop circuit device 22. As a result, the D-flip-flop circuit device 23 outputs the H level. Thereby, the excusive-OR circuit device 13 outputs an H level from the L level and the H level output from the respective D-flip-flop circuit devices 21 and 23. This H level is output during the L level of the register reading out signal Sr via the bus driver 31, and is read out as a status bit of "1" by the external CPU or so (see (g) of FIG. 11). Same as in the above mention, when this read-clear-type status bit circuit 100 is applied as the above-mentioned circuit for setting a DCTS bit for an MSR, the above-mentioned "1" is read out as the DCTS bit.

Then, in Step (5), with the L level and the H level output by these two flip-flop circuit devices 21 and 22, the exclusive-OR circuit device 12 outputs an L level which is an inverted value of the exclusive-OR operation, as the status detecting part clearing signal Sc. In Step (6), this signal is received by the external status detecting part 200, which then returns according to this L level of the status detecting part clearing signal Sc the status detection signal which was once generated in the H level into the L level.

In Step (7), the register reading out signal returns into the L level, and in Step (8), responding thereto, the D-flip-flop circuit device 22 takes in the L level output from the D-flip-flop circuit device 21. In Step (9), the exclusive-OR circuit device 12 receives the L levels of both the two D-flip-flop circuit devices 21 and 22 and outputs the H level which is an inverted value of the L level which is the exclusive-OR operation result. As a result, the status detecting part clearing signal returns into the H level which corresponds to the inactive state.

In Step (10), when the register reading out signal comes to have the L level again, the D-flip-flop circuit devices 21 responds thereto in Step (11) so as to take in the output of the exclusive-OR circuit device 11. In this case, the status detection signal already returns into the L level as mentioned above, while the D-flip-flop circuit device 22 outputs the L level, and thus, the signal thus taken in by D-flip-flop circuit device 21 from the exclusive-OR circuit device 11 has the L level which is the exclusive-OR operation result thereof. Then, in Step (12), the above-mentioned change in the register reading out signal into the L level causes the D-flip-flop circuit device 23 to take in the L level output from the D-flip-flop circuit device 22, and outputs the L level. As a result, the exclusive-OR circuit device 13 outputs the L level which is the exclusive-OR operation result of the above-mentioned L level output and the L level output of the D-flip-flop circuit device 21.

This output is read out as the status bit "0" via the bus driver 31 during the L level of the register reading out signal (see (g) of FIG. 11). Same as the above mention, when this read-clear-type status bit circuit 100 is applied as the above-mentioned circuit for setting a DCTS bit for an MSR, the above-mentioned "0" is read out as the DCTS bit.

Thus, according to the read-clear-type status bit circuit 100 in the embodiment of the present invention, when the register reading out signal Sr is made active after the status detection signal Sd is made active, the status detection part clearing signal Sc is made active immediately after that. Thereby, the active state of the status detection signal Sd is cancelled soon. In response thereto, the status bit is returned into "0" during the subsequent active interval in the register reading out signal. Accordingly, it is possible to positively avoid reading out of the same status again by the CPU or so.

Thus, according to the present invention, as illustrated in FIG. 11, the D-flip-flop circuit device 21 is inverted after detecting the status, and as a result, the inverting operation is propagated in sequence through the D-flip-flop circuit devices 22 and 23 (see FIG. 11, (b), (c) and (d)). Then, after that, the thus-occurring state is maintained until another status detection occurs again.

According to the present invention, during the above-mentioned propagation of the inverting operation through the plurality of D-flip-flop circuit devices 21, 22 and 23 in sequence, detection of a temporary difference in the state between these D-flip-flop circuit devices 21 and 23 is detected as a status detection recognition state. As a result, "1" is set in the status bit, and simultaneously, the status detecting part clearing signal is output in the active state. Further, a coincidence in the state between the D-flip-flop circuit devices 21 and 23 is then detected as a status detection recognition acknowledgement state, and as a result, the status bit is then released into "0".

Thus, according to the present invention, the status detection result is positively recognized, and thus, this recognition is reflected by the status bit of "1". Then, simultaneously, the clearing signal is fed back, and thereby, the active state of the status detection signal is cancelled immediately. Further, after the status detection result recognition processing is performed, the status bit is then immediately released into "0".

With reference to FIG. 12, operation of the above-described read-clear-type status bit circuit 100 according to the embodiment of the present invention will now be described in which the status detection signal Sd becomes active, i.e., comes to have the H level during the L level of the register reading out signal Sr. In this case, in Step (1) of FIG. 12, the register reading out signal=L occurs. Thereby, in Step (2), this change in the register reading out signal into the L level causes the D-flip-flop circuit device 21 to take in an output of the exclusive-OR circuit device 11.

In this case, the status detection signal has the L level, and also, the output of the D-flip-flop circuit device 22 has the L level. Accordingly, the output of the exclusive-OR circuit device 11 has the L level. As a result, the output of the D-flip-flop circuit device 21 is kept in the L level.

On the other hand, in Step (3), the above-mentioned change in the register reading out signal into the L level causes the D-flip-flop circuit device 23 to take in the L level output of the D-flip-flop circuit device 22. As a result, at this time, both the outputs of the D-flip-flop circuit devices are kept in the L level, and thus, the output of the exclusive-OR circuit device 13 is also kept in the L level. Thereby, during the L level of the register reading out signal, the L level is output via the bus driver 31 as the status bit, and as a result, "0" is read out as the status bit (in other words, DCTS bit) (see (g) of FIG. 12).

Then, when, in Step (4), the status detecting part detects the predetermined status and thus turns the status detection signal into the H level during the L level of the register reading out signal, the change of the register reading signal into the L level which after that occurs again in Step (5) causes the D-flip-flop circuit device 21 to take in the output of the exclusive-OR circuit device 11 upon the above-mentioned change in the register reading out signal in Step (6).

At this time, the status detection signal Sd thus has the H level as mentioned above and the output of the D-flip-flop circuit device 22 has the L level. As a result, the output of the exclusive-OR circuit device 11 has the H level, and also, the D-flip-flop circuit device 21 which takes therein then has the H level. In Step (7), the above-mentioned change in the register reading out signal into the L level causes the D-flip-flop circuit device 23 to take in the L level output of the D-flip-flop circuit device 22 while the D-flip-flop circuit device 21 has the H level as mentioned above. As a result the exclusive-OR circuit device 13 outputs the H level. This is then output as the status bit signal Sb via the bus driver 31, and thus, the status bit (i.e., DCTS bit) "1" is read out.

Also in Step (8), the H level and L level outputs of the respective D-flip-flop circuit devices 21 and 22 cause the exclusive-OR circuit device 12 to output the L level which is the inverted value of the exclusive-OR operation result thereof as the status detecting part clearing signal. As a result, the active state in the status detection signal Sd shown in FIG. 12, (a) is cancelled into the L level as shown.

When the register reading out signal is returned into the H level in Step (9), the D-flip-flop circuit device 22 responds thereto in Step (10) and takes in the H level output of the D-flip-flop circuit device 21. Then, in Step (11), both the H level outputs of the respective D-flip-flop circuit devices 21 and 22 cause the exclusive-OR circuit device 12 to have the inverted operation result output returned into the H level. Thereby, the active state of the status detecting part clearing signal is cancelled as shown (FIG. 12, (e)).

Then, in Step (12), the register reading out signal=L occurs subsequently, and in Step (13), this change in the register reading out signal into the L level causes the D-flip-flop circuit device 21 to take in the output of the exclusive-OR circuit device 11. At this time, the status detection signal Sd has the L level, the D-flip-flop circuit device 22 has the H level output, and thus, the output of the exclusive-OR circuit device 11 has the H level. The D-flip-flop circuit device 21 takes therein. In Step (14), upon the above-mentioned change in the register reading out signal into the L level, the D-flip-flop circuit device 23 takes in the above-mentioned H level output of the D-flip-flop circuit device 22. As a result, both the outputs of the respective D-flip-flop circuit devices 21 and 23 have the H levels, which cause the exclusive-OR circuit device 13 to output the L level. As a result, "0" is read out as the status bit (i.e., DCTS bit).

Thus, according to the embodiment of the present invention, even in case the status detection signal Sd becomes active, i.e., comes to have the H level during the L level of the register reading out signal Sr, i.e., during the active state in the register reading out signal Sr, the status bit is set as being "1" by recognizing it, when the register reading out signal Sr becomes active subsequently. Then, immediately after that, the status detecting part clearing signal is made active so that the status detection state is cancelled thereby soon. As a result, the active state in the status detection signal Sd is cancelled accordingly. As a result, even in this case, reading out of the status detection is prevented from being missed, and also, a plurality of times of reading out of the same status detection is also avoided. Accordingly, the above-mentioned requirements needed for the status bit can be fully satisfied.

Although the circuit configuration shown in FIG. 10 includes the three D-flip-flop circuit devices 21, 22 and 23, it is also possible to achieve a similar function only by two D-flip-flop circuit devices 21 and 22 instead of the three. In such a case, the output of the D-flip-flop circuit device 22 is directly connected to the exclusive-OR circuit device 13 without passing through the D-flip-flop circuit device 23, and thus, the exclusive-OR circuit device 13 inputs thereto the outputs of the respective D-flip-flop circuit devices 21 and 22 same as in the exclusive-OR circuit device 12. In this case, in Step (3) in FIG. 11 in which the values of the D-flip-flop circuit devices 21 and 22 differ from one another, the status bit is set into "1" (H level of the exclusive-OR circuit device 13), and simultaneously, the status detecting part clearing signal Sc is made active ((L level of the inversion of the exclusive-OR circuit device 12), same as in the case of the original circuit configuration. Then, in Step (8), when the values of the D-flip-flop circuit devices 21 and 22 coincide with one another, the status bit is reset into "0" (L level of the exclusive-OR circuit device 13) simultaneously as the status detecting part clearing signal Sc is made inactive (H level of the inversion of the exclusive-OR circuit device 12), different from the case of the original circuit configuration.

Figure 13:
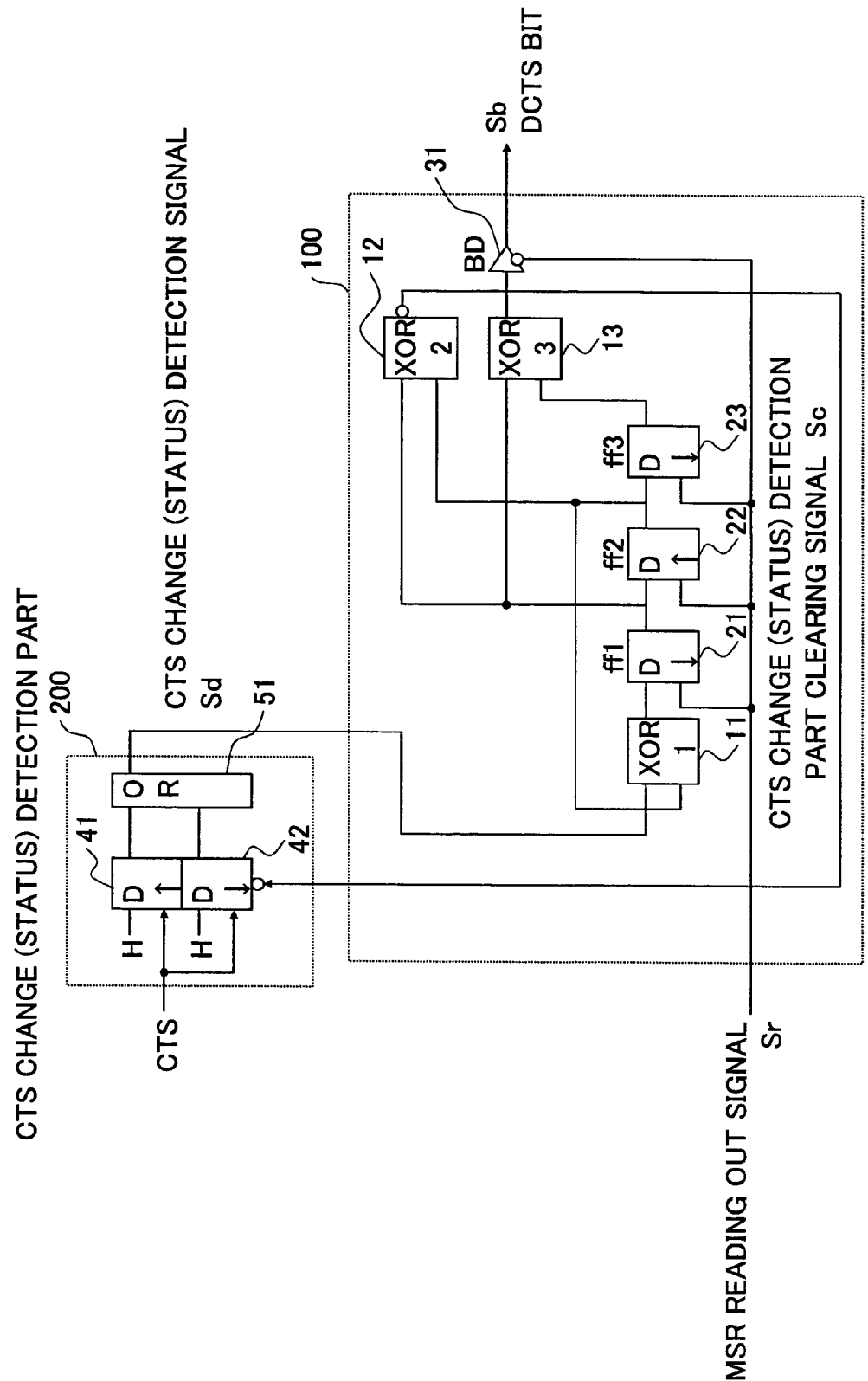
FIG. 13 shows a circuit configuration obtained in case where the circuit configuration shown in FIG. 10 is applied to a DCTS bit setting circuit for an MSR.
Figure 14:
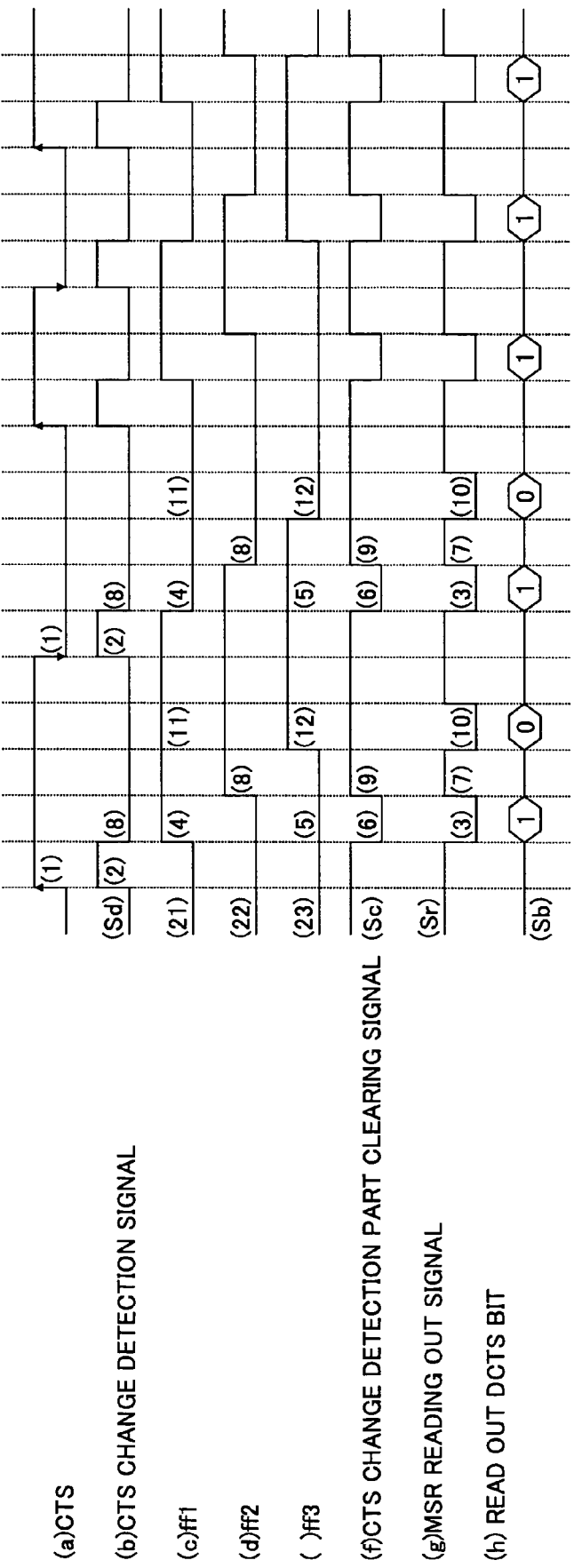

FIG. 13 shows a circuit configuration in case where the read-clear-type status bit circuit shown in FIG. 10 is applied to a DCTS bit setting circuit for an MSR in the above-mentioned UART. In this case, the status detecting part shown in FIG. 11 is embodied by a CTS change detecting part 200, and the CTS change detecting part 200 includes two D-flip-flop circuit devices 41 and 42 and an OR circuit device 51. As shown in FIG. 14, (a), in response to a level change of a CTS line, a CTS change detection signal Sd is activated accordingly as shown in FIG. 14, (b). That is, in FIG. 14, when the CTS line level is changed into an H level in Step (1) (left side), the D-flip-flop circuit device 41 takes in an H level applied to its D terminal, and as a result, the OR device 51 outputs an H level. Thereby, in Step (2) (left side), the CTS detection signal Sd has the H level. Then, in response to a CTS detecting part clearing signal Sc being activated, i.e., being turned into an L level in Step (6) (left side), the D-flip-flop circuit devices 41 and 42 are reset, and thus the output of the OR device 51 is returned to the L level. As a result, in Step (8) (left side), the CTS change detection signal Sd is returned into the L level.

Similarly, on the right side of FIG. 14, when the CTS line level is changed into an L level in Step (1) (right side), the D-flip-flop circuit device 42 takes an H level applied to its D terminal, and as a result, the OR device 51 outputs an H level. Thereby, in Step (2) (right side), the CTS detection signal Sd has the H level. Then, in response to the CTS detecting part clearing signal Sc being activated, i.e., turned into the L level in Step (6) (right side), the D-flip-flop circuit devices 41 and 42 are reset, and thus the output of the OR device 51 is returned to the L level. As a result, in Step (8) (right side), the CTS change detection signal Sd is returned into the L level.

Other than the above-mentioned operations, operations of the circuit 100 illustrated in FIGS. 14 and 15 responding to change in the level of the CTS change detection signal Sd are same as those of the circuit shown in FIG. 10 illustrated with reference to FIGS. 11 and 12, and the duplicated descriptions therefor will be omitted. There, the above-mentioned status detection signal Sd is read as the CTS change detection signal Sd, the register reading out signal Sr is read as an MSR reading out signal (FIG. 14, (g)), the status detecting part clearing signal Sc is read as the CTS detecting part clearing signal Sc (FIG. 14, (f)), and the status bit Sb is read as a DCTS bit Sd (FIG. 14, (h)).

FIG. 14 illustrates a case where a CTS change (status) occurs at timing other than the interval in which the MSR reading out signal Sr is active, and FIG. 15 illustrates a case where a CTS change (status) occurs at timing during the interval in which the MSR reading out signal Sr is active.

Thus, according to the embodiment of the present invention, since no clock signal is needed for the circuit operation, a proper operation can be always ensured even under a condition where the clock signal is stopped or the clock frequency is lowered according to a power saving function or so. Furthermore, since the status detecting part clearing signal is provided, the present invention can be applied either for a case where a status detecting method applied in the status detecting part is a method of detecting an edge of the CTS signal or for a case where it is a method of detecting a level of the same signal, in the same manner.

Furthermore, since the circuit configuration does not apply so-called gate delay, the present invention can be applied widely without regard to particular types of technology of LSI, such as an ASIC or so.

The present invention is not limited to the above-described embodiments, and variations and modifications may be made without departing from the claimed scope of the present invention.

The present application is based on Japanese priority application No. 2003-083473, filed on Mar. 25, 2003, the entire contents of which are hereby incorporated by reference.

What is claimed is:

1. A state indicating information setting circuit, comprising:
   a first state holding part for inputting thereto a signal indicating either a predetermined first state or a predetermined second state, holding the state indicated by said signal input and outputting said state;
   a second state holding part for inputting thereto the signal output from said first state holding part, holding the state indicated by said signal input and outputting said state;

a first state comparing part inputting thereto a predetermined state detection signal and the signal output from said second state holding part, and outputting a signal indicating said predetermined first state to said first state holding part when the respective states indicated by the respective signals input are different from one another, and outputting a signal indicating said predetermined second state when these states are same as one another;

a second state comparing part comparing the states of the respective signals output from said first state holding part and said second state holding part, and outputting a signal indicating said predetermined second state as a state detection signal clearing signal when the respective states indicated by said input signals are different from one another; and a third state comparing part comparing the states of the respective signals output from said first state holding part and said second state holding part, outputting a state detection signal indicating said predetermined first state when said states of the respective signals input are different from each other, and outputting the state non-detection signal indicating said predetermined second state when said states are same as one another.

2. A state indicating information setting circuit, comprising:

a first state holding part inputting thereto a signal indicating either a predetermined first state or a predetermined second state, holding the state indicated by said signal input, and outputting said state;

a second state holding part inputting thereto the signal output from said first state holding part, and holding and outputting the state indicated by said signal input, and outputting said state;

a third state holding part inputting thereto the signal output from said second state holding part, and holding and outputting the state indicated by said signal input, and outputting said state;

a first state comparing part inputting thereto a predetermined state detection signal and the signal output from said second state holding part, outputting a signal indicating said predetermined first state to said first state holding part when the respective states indicated by the respective signals input are different from one another, and outputting a signal indicating said predetermined second state when these states are same as one another;

a second state comparing part comparing the states of the respective signals output from said first state holding part and said second state holding part, and outputting a signal indicating said predetermined second state as a state detection signal clearing signal when the respective states indicated by said input signals are different from one another; and a third state comparing part comparing the states of the respective signals output from said first state holding part and said third state holding part, outputting a state detection signal indicating said predetermined first state when said states of the respective signals input are different from each other, and outputting the state non-detection signal indicating said predetermined second state when said states given are same as one another.

3. A state indicating information setting circuit, comprising:

a first state holding part holding a state of an input signal, and outputting a signal indicating said state thus held;

a second state holding part holding the state of the signal output from said first state holding part, and outputting a signal indicating said state thus held;

a state inverting part responsive to a predetermined state detection signal for outputting to said first state holding part a signal indicating a state which is different from the state indicated by the signal output from said second state holding part;

a state detection signal outputting part comparing the states of the respective signals output from said first state holding part and said second state holding part, outputting the state detection signal when said states are different from one another, and outputting a state non-detection signal when said states are same as one another; and a state detection signal clearing part comparing the states of the respective signals output from said first state holding part and said second state holding part, and outputting a state detection signal clearing signal when said states are different from one another.

4. A state indicating information setting circuit, comprising:

a first state holding part holding a state of an input signal, and outputting a signal indicating said state thus held;

a second state holding part holding the state of the signal output from said first state holding part, and outputting a signal indicating said state thus held;

a third state holding part holding the state of the signal output from said second state holding part, and outputting a signal indicating said state thus held;

a state inverting part responsive to a predetermined state detection signal for outputting to said first state holding part a signal indicating a state which is different from the state indicated by the signal output from said second state holding part;

a state detection signal outputting part comparing the states of the respective signals output from said first state holding part and said third state holding part, outputting the state detection signal when said states are different from one another, and outputting a state non-detection signal when said states are same as one another; and a state detection signal clearing part comparing the states of the respective signals output from said first state holding part and said second state holding part, and outputting a state detection signal clearing signal when said states are different from one another.

5. A state indicating information setting circuit, comprising:

a first flip-flop circuit taking an input signal when a register read out signal has an L level;

a second flip-flop circuit taking a signal output from said first flip-flop circuit when the register read out signal has an H level;

a third flip-flop circuit taking a signal output from said second flip-flop circuit when the register read out signal has the L level;

a first exclusive-OR circuit performing an exclusive-OR operation between an output of said second flip-flop circuit and a predetermined state detection signal, and outputting a result of the exclusive-OR operation;

a second exclusive-OR circuit performing an exclusive-OR operation between an output of said first flip-flop circuit and an output of said second flip-flop circuit, and outputting a result of the exclusive-OR operation; and
a third exclusive-OR circuit performing an exclusive-OR operation between an output of said first flip-flop circuit and an output of said third flip-flop circuit, and outputting a result of the exclusive-OR operation as a state bit signal.

6. A status bit setting circuit, comprising:
a first logic circuit which receives a status detection signal from an external status detecting part:
a first edge-triggering flip-flop circuit device which receives an output of the first logic circuit:
a second edge-triggering flip-flop circuit device which receives an output of the first edge-triggering flip-flop circuit device;
a third edge-triggering flip-flop circuit device which receives an output of the second edge-triggering flip-flop circuit device;
a second logic circuit which receives outputs of the first edge-triggering flip-flop circuit device and the second edge-triggering flip-flop circuit device;
a third logic circuit which receives outputs of the first edge-triggering flip-flop circuit device and the third edge-triggering flip-flop circuit device; and
a bus driver which receives an output of the third logic circuit and outputs a status bit signal.

7. The status bit setting circuit as claimed in claim 6, further comprising:
a status detection canceling part detecting process of an inversion transition in said first, second, and third edge-triggering flip-flop circuit devices and generating a signal canceling a status detection state.

8. The status bit setting circuit as claimed in claim 6, further comprising:
a status bit setting part detecting a completion of a propagation of an inversion transition in said first, second, and third edge-triggering flip-flop circuit devices and canceling the setting of a predetermined status bit.

9. The status bit setting circuit as claimed in claim 8, wherein:
said first, second, and third edge-triggering flip-flop circuit devices have states alternately inverted in sequence in response to a rising edge and a decaying edge of a predetermined read out signal.

10. The status bit setting circuit claimed in claim 6, wherein:
the bus driver enables reading out of a predetermined status bit externally only during an interval in which a predetermined read out signal is active.

* * * * *

UNITED STATES PATENT AND TRADEMARK OFFICE
CERTIFICATE OF CORRECTION

PATENT NO.        : 7,159,058 B2                                         Page 1 of 1
APPLICATION NO.   : 10/773232
DATED             : January 2, 2007
INVENTOR(S)       : Yoshiki Okumura It is certified that error appears in the above-identified patent and that said Letters Patent is hereby corrected as shown below:

Title Page, Column 2 (Other Publications), Lines 1-2, change "wikipedia.org.wiki/Flip-flop" to -- wikipedia.org/wiki/Flip-flop--.

Column 19, Line 10, change "part:" to --part;--.

Column 19, Line 12. change "circuit:" to --circuit;--.

Column 20, Line 3, after "detecting" insert --a--.

Signed and Sealed this

Tenth Day of April, 2007

JON W. DUDAS
*Director of the United States Patent and Trademark Office*